US010438818B2

(12) United States Patent
Kunisawa et al.

(10) Patent No.: US 10,438,818 B2
(45) Date of Patent: Oct. 8, 2019

(54) SUBSTRATE PROCESSING APPARATUS AND PIPE CLEANING METHOD FOR SUBSTRATE PROCESSING APPARATUS

(71) Applicant: EBARA CORPORATION, Tokyo (JP)

(72) Inventors: Junji Kunisawa, Tokyo (JP); Toru Maruyama, Tokyo (JP); Masayoshi Imai, Tokyo (JP); Koji Maeda, Tokyo (JP); Mitsuru Miyazaki, Tokyo (JP); Teruaki Hombo, Tokyo (JP); Fujihiko Toyomasu, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 141 days.

(21) Appl. No.: 15/128,309

(22) PCT Filed: Mar. 17, 2015

(86) PCT No.: PCT/JP2015/057938
§ 371 (c)(1),
(2) Date: Sep. 22, 2016

(87) PCT Pub. No.: WO2015/146724
PCT Pub. Date: Oct. 1, 2015

(65) Prior Publication Data
US 2017/0117165 A1    Apr. 27, 2017

(30) Foreign Application Priority Data
Mar. 27, 2014    (JP) .................. 2014-066998

(51) Int. Cl.
*H01L 21/67* (2006.01)
*H01L 21/687* (2006.01)
(Continued)

(52) U.S. Cl.
CPC .......... *H01L 21/67051* (2013.01); *B08B 3/08* (2013.01); *B08B 9/027* (2013.01);
(Continued)

(58) Field of Classification Search
CPC ................................. H01L 21/67051
See application file for complete search history.

(56) References Cited

U.S. PATENT DOCUMENTS

| 4,537,640 A | * 8/1985 | Kreisel | .................. B08B 3/02 134/18 |
| 5,073,268 A | 12/1991 | Saito et al. | |

(Continued)

FOREIGN PATENT DOCUMENTS

| CN | 101494164 A | 7/2009 |
| CN | 101599423 A | 12/2009 |

(Continued)

OTHER PUBLICATIONS

English translation of International Search Report for Application No. PCT/JP2015/057938 dated May 8, 2015.

*Primary Examiner* — Jason Y Ko
(74) *Attorney, Agent, or Firm* — Pearne & Gordon LLP

(57) ABSTRACT

The present invention relates to a substrate processing apparatus for processing a substrate, such as a wafer, while supplying a cleaning liquid (e.g. pure water and a liquid chemical) to the substrate, and also relates to a pipe cleaning method for the substrate processing apparatus. The substrate processing apparatus includes: a first cleaning lane including first cleaning units (52), (54) each for cleaning a substrate while supplying pure water to the substrate; a second cleaning lane including second cleaning units (60), (62) each for cleaning a substrate while supplying pure water to the substrate; a first pure-water supply pipe (120) for supplying the pure water to the first cleaning lane; and a second pure-water supply pipe (180) for supplying the pure water to the second cleaning lane.

13 Claims, 12 Drawing Sheets

(51) Int. Cl.
*B08B 3/08* (2006.01)
*B08B 9/027* (2006.01)
*H01L 21/02* (2006.01)

(52) U.S. Cl.
CPC .. *H01L 21/02052* (2013.01); *H01L 21/67046* (2013.01); *H01L 21/68728* (2013.01)

(56) References Cited

U.S. PATENT DOCUMENTS

| | | |
|---|---|---|
| 5,542,441 A | 8/1996 | Mohindra |
| 2009/0305612 A1 | 12/2009 | Miyazaki |
| 2014/0216505 A1* | 8/2014 | Toyomasu ........ H01L 21/67017 134/36 |
| 2015/0258465 A1* | 9/2015 | Mitsuoka .......... H01L 21/02057 134/109 |

FOREIGN PATENT DOCUMENTS

| | | |
|---|---|---|
| JP | 63-069588 A | 3/1988 |
| JP | H03-188988 A | 8/1991 |
| JP | 04-139822 A | 5/1992 |
| JP | 06-277638 A | 10/1994 |
| JP | H10-099855 A | 4/1998 |
| JP | H10-505537 A | 6/1998 |
| JP | 2008-246319 A | 10/2008 |
| JP | 2010-050436 A | 3/2010 |

\* cited by examiner

SUBSTRATE PROCESSING APPARATUS AND PIPE CLEANING METHOD FOR SUBSTRATE PROCESSING APPARATUS

TECHNICAL FIELD

The present invention relates to a substrate processing apparatus for processing a substrate, such as a wafer, while supplying a cleaning liquid (e.g. pure water and a liquid chemical) onto the substrate, and also relates to a pipe cleaning method for such a substrate processing apparatus.

BACKGROUND ART

With the recent progress toward higher integration of semiconductor devices, the circuit interconnects are becoming finer and the interconnect spacing is becoming narrower. In the manufacturing of a semiconductor device, films of a variety of materials are repeatedly formed on a substrate, such as a wafer, to form a multi-layer structure. A technique of planarizing the surface of the substrate is important for the formation of the multi-layer structure. Substrate processing apparatuses for performing chemical mechanical polishing (CMP) are widely used as a means to planarize the surface of the substrate.

Such a substrate processing apparatus generally includes a polishing table to which a polishing pad is attached, a polishing head for holding a wafer, and a polishing liquid nozzle for supplying a polishing liquid onto the polishing pad. While rotating the polishing head and the polishing table individually and supplying the polishing liquid from the polishing liquid nozzle onto the polishing pad, the wafer is pressed against the polishing pad by means of the polishing head, thereby polishing the wafer.

Unwanted residues remain on the polished wafer. In order to remove such residues from the wafer, the substrate processing apparatus includes a plurality of cleaning units for cleaning the wafer, and a plurality of drying units for drying the cleaned wafer. FIG. 12 is a schematic view showing layout of cleaning units and drying units provided in a conventional substrate processing apparatus. As shown in FIG. 12, the substrate processing apparatus is provided with two cleaning lanes: an upper cleaning lane and a lower cleaning lane. In the upper cleaning lane, a wafer is transported in the order of: an upper cleaning unit 152, an upper cleaning unit 154, and an upper drying unit 156, while in the lower cleaning lane, a wafer is transported in the order of: a lower cleaning unit 160, a lower cleaning unit 162, and a lower drying unit 164. Two wafers are cleaned and dried in parallel in the upper and lower cleaning lanes.

In the upper cleaning unit 152, the upper cleaning unit 154, the lower cleaning unit 160 and the lower cleaning unit 162, a wafer is cleaned with a cleaning member, such as a brash or a sponge, which is rubbed against the wafer while a liquid chemical is being supplied to front and back surfaces of the wafer, followed by rinsing of the wafer with pure water. In the upper drying unit 156 and the lower drying unit 164, the front surface of the wafer is rinsed with pure water, and then the wafer is dried by an IPA vapor (gas mixture of isopropyl alcohol and $N_2$ gas) which is supplied to the front surface of the wafer.

The pure water is supplied to the cleaning units 152, 154, 160, 162 and the drying units 156, 164 for processing of a wafer. Therefore, as shown in FIG. 12, a pure-water supply pipe 300 extending from a factory pure-water line, which is one of factory utilities, is coupled to each of the cleaning units 152, 154, 160, 162 and the drying units 156, 164. The pure-water supply pipe 300 is equipped with a main pure-water valve 301.

Bacteria may grow in the cleaning units 152, 154, 160, 162 and the drying units 156, 164. Living or dead bacteria may be conveyed, along with pure water, to a wafer, thus contaminating the wafer. It is, therefore, conventional practice upon the growth of bacteria to inject a hydrogen peroxide solution into the pure-water supply pipe 300 to kill bacteria, and subsequently inject pure water into the pure-water supply pipe 300 to clean (flush) the interior of the pure-water supply pipe 300.

The pure water is distributed from the single pure-water supply pipe 300 to the cleaning units 152, 154, 160, 162 and the drying units 156, 164. When bacteria grow in one of the units 152, 154, 160, 162, 156, 164 in such a pure-water supply system, a hydrogen peroxide solution should necessarily be introduced into the entirety of the pure-water supply pipe 300. As a result, both of the upper cleaning lane and the lower cleaning lane become unavailable for cleaning of wafers. It may take several hours to complete cleaning of the pipe using the hydrogen peroxide solution. This causes the problem of long downtime during which processing of a wafer is stopped.

CITATION LIST

Patent Literature

Patent document 1: Japanese laid-open patent publication No. 2010-50436

SUMMARY OF INVENTION

Technical Problem

It is therefore an object of the present invention to provide a substrate processing apparatus which can continue processing of a substrate even when bacteria have grown in one of a plurality of cleaning units. It is also an object of the present invention to provide a pipe cleaning method for the substrate processing apparatus.

Solution to Problem

In order to achieve the object, the present invention, in one aspect, provides a substrate processing apparatus comprising: a first cleaning lane including a plurality of first cleaning units each for cleaning a substrate while supplying pure water to the substrate; a second cleaning lane including a plurality of second cleaning units each for cleaning a substrate while supplying pure water to the substrate; a first pure-water supply pipe for supplying the pure water to the first cleaning lane; and a second pure-water supply pipe for supplying the pure water to the second cleaning lane.

In a preferred embodiment, the substrate processing apparatus further comprises a first introduction port and a second introduction port for introducing a hydrogen peroxide solution into the first pure-water supply pipe and the second pure-water supply pipe, respectively.

In a preferred embodiment, each of the first cleaning units includes a first pure-water supply nozzle for supplying pure water to the substrate, and a first liquid-chemical supply nozzle for supplying a mixture of pure water and a liquid chemical to the substrate; and the first pure-water supply pipe includes a first pure-water supply line coupled to the first pure-water supply nozzle, and a first pure-water mixing line coupled to the first liquid-chemical supply nozzle.

In a preferred embodiment, the first pure-water mixing line extends to the first liquid-chemical supply nozzle via a mixer for mixing the pure water and the liquid chemical.

In a preferred embodiment, each of the second cleaning units includes a second pure-water supply nozzle for supplying pure water to the substrate, and a second liquid-chemical supply nozzle for supplying a mixture of pure water and a liquid chemical to the substrate. The second pure-water supply pipe includes a second pure-water supply line coupled to the second pure-water supply nozzle, and a second pure-water mixing line coupled to the second liquid-chemical supply nozzle.

In a preferred embodiment, the second pure-water mixing line extends to the second liquid-chemical supply nozzle via a mixer for mixing the pure water and the liquid chemical.

In a preferred embodiment, the first cleaning lane further includes a first drying unit for supplying pure water to the substrate and then drying the substrate, and the second cleaning lane further includes a second drying unit for supplying pure water to the substrate and then drying the substrate.

The present invention, in another aspect, provides a pipe cleaning method for a substrate processing apparatus which includes a first cleaning lane including a plurality of first cleaning units each for cleaning a substrate while supplying pure water to the substrate, a second cleaning lane including a plurality of second cleaning units each for cleaning a substrate while supplying pure water to the substrate, a first pure-water supply pipe for supplying the pure water to the first cleaning lane, and a second pure-water supply pipe for supplying the pure water to the second cleaning lane, said method comprising: supplying a hydrogen peroxide solution into the first pure-water supply pipe to fill the first pure-water supply pipe with the hydrogen peroxide solution; leaving the first pure-water supply pipe, filled with the hydrogen peroxide solution, as it is for a predetermined time, while cleaning a substrate in the second cleaning lane; and thereafter supplying pure water into the first pure-water supply pipe to clean the first pure-water supply pipe.

In a preferred embodiment, a flow rate of the pure water when cleaning the first pure-water supply pipe is higher than a flow rate of the pure water when cleaning the substrate.

In a preferred embodiment, a concentration of hydrogen peroxide in the hydrogen peroxide solution is in a range of 5 to 6%.

In a preferred embodiment, the predetermined time is not less than four hours.

In a preferred embodiment, a time for supplying the pure water into the first pure-water supply pipe to clean the interior of the first pure-water supply pipe is not less than one hour.

In a preferred embodiment, the pipe cleaning method further comprises: after the cleaning of the interior of the first pure-water supply pipe by supplying the pure water into the first pure-water supply pipe, supplying a hydrogen peroxide solution into the second pure-water supply pipe to fill the second pure-water supply pipe with the hydrogen peroxide solution; leaving the second pure-water supply pipe, filled with the hydrogen peroxide solution, as it is for a predetermined time, while cleaning a substrate in the first cleaning lane; and thereafter supplying pure water into the second pure-water supply pipe to clean the second pure-water supply pipe.

Advantageous Effects of Invention

According to the present invention, there are provided two systems: the first pure-water supply pipe and the second pure-water supply pipe. The first pure-water supply pipe and the second pure-water supply pipe are coupled to the first cleaning lane and the second cleaning lane, respectively, to independently supply pure water to the first cleaning lane and the second cleaning lane. Therefore, when bacteria grow in one of the first cleaning lane and the second cleaning lane, a hydrogen peroxide solution can be supplied into only the pure-water supply pipe of that cleaning lane in which bacteria have grown. Accordingly, processing of substrates can be continued in the cleaning lane in which no bacteria grow.

DESCRIPTION OF EMBODIMENTS

Figure 1:
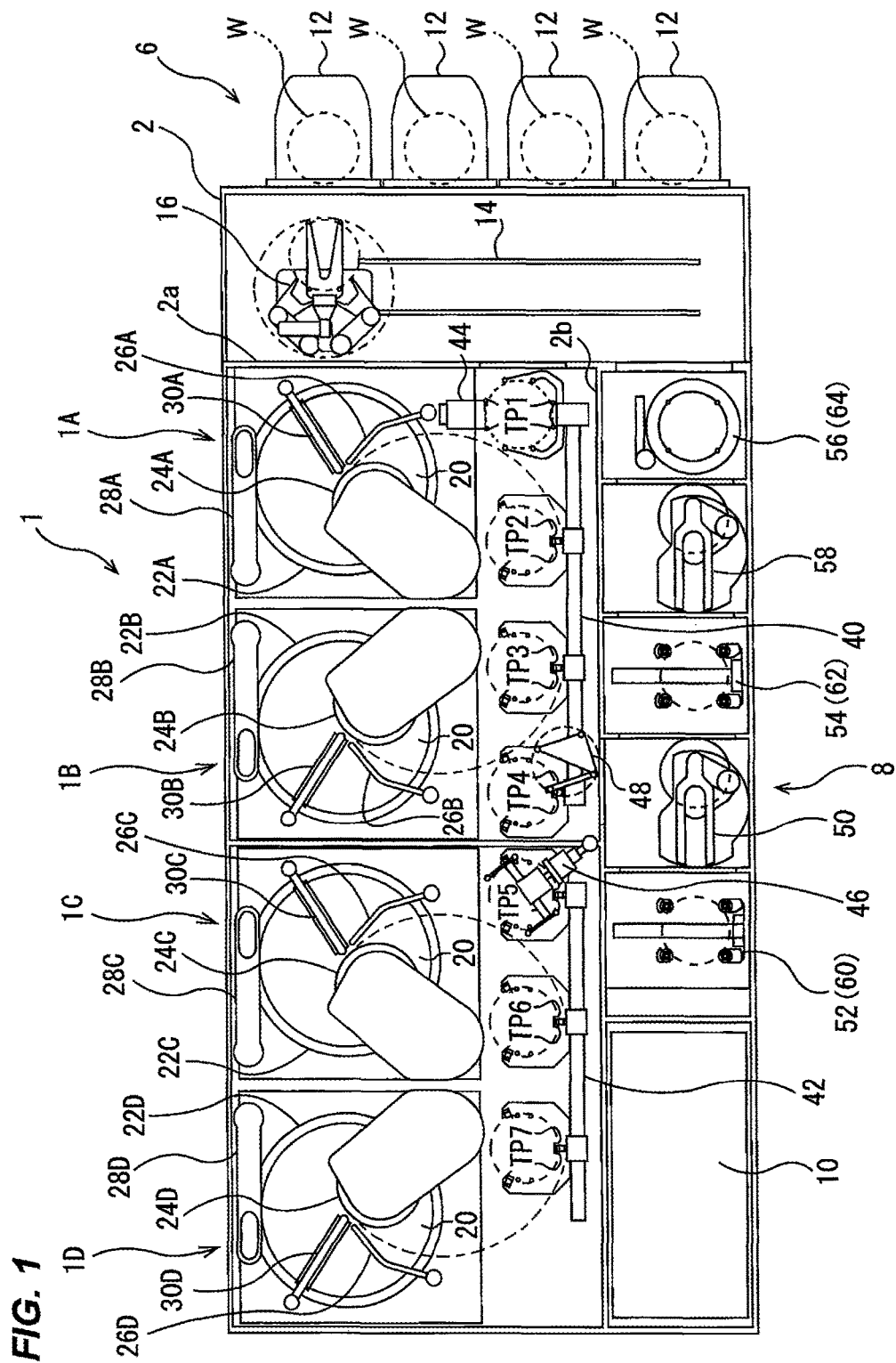
FIG. 1 is a diagram showing a substrate processing apparatus including polishing units, cleaning units and drying units according to an embodiment of the present invention.

Embodiments of the present invention will be described with reference to the drawings. FIG. 1 is a view showing a substrate processing apparatus having polishing units, cleaning units, and drying units according to an embodiment of the present invention. This substrate processing apparatus is an apparatus capable of performing a series of processes including polishing, cleaning, and drying of a wafer which is an example of a substrate. As shown in FIG. 1, the substrate processing apparatus has a housing 2 in approximately a rectangular shape. An interior space of the housing 2 is divided by partitions 2a, 2b into a load-unload section 6, a polishing section 1, and a cleaning section 8. The substrate processing apparatus includes an operation controller 10 configured to control wafer processing operations.

The load-unload section 6 has load ports 12 on which wafer cassettes are placed, respectively. A plurality of wafers W are stored in each wafer cassette. The load-unload section 6 has a moving mechanism 14 extending along an arrangement direction of the load ports 12. A transfer robot (or loader) 16 is provided on the moving mechanism 14, so that the transfer robot 16 can move along the arrangement direction of the wafer cassettes. The transfer robot 16 moves on the moving mechanism 14 so as to access the wafer cassettes mounted to the load ports 12.

The polishing section 1 is an area where a wafer W is polished. This polishing section 1 includes a first polishing unit 1A, a second polishing unit 1B, a third polishing unit 1C, and a fourth polishing unit 1D. The first polishing unit 1A includes a first polishing table 22A to which a polishing pad 20, having a polishing surface, is attached, a first polishing head 24A for holding a wafer W and pressing the wafer W against the polishing pad 20 on the first polishing table 22A so as to polish the wafer, a first polishing liquid supply nozzle 26A for supplying a polishing liquid (e.g., slurry) and a dressing liquid (e.g., pure water) onto the polishing pad 20, a first dressing unit 28A for dressing the polishing surface of the polishing pad 20, and a first atomizer 30A for ejecting a liquid (e.g., pure water), or a mixture of a liquid (e.g., pure water) and a gas (e.g., nitrogen gas) in an atomized state onto the polishing surface of the polishing pad 20.

Similarly, the second polishing unit 1B includes a second polishing table 22B to which a polishing pad 20 is attached, a second polishing head 24B, a second polishing liquid supply nozzle 26B, a second dressing unit 28B, and a second atomizer 30B. The third polishing unit 1C includes a third polishing table 22C to which a polishing pad 20 is attached, a third polishing head 24C, a third polishing liquid supply nozzle 26C, a third dressing unit 28C, and a third atomizer 30C. The fourth polishing unit 1D includes a fourth polishing table 22D to which a polishing pad 20 is attached, a fourth polishing head 24D, a fourth polishing liquid supply nozzle 26D, a fourth dressing unit 28D, and a fourth atomizer 30D.

A first linear transporter 40 is disposed adjacent to the first polishing unit 1A and the second polishing unit 1B. The first linear transporter 40 is a device for transporting a wafer W between four transfer positions (i.e., a first transfer position TP1, a second transfer position TP2, a third transfer position TP3 and a fourth transfer position TP4). A second linear transporter 42 is disposed adjacent to the third polishing unit 1C and the fourth polishing unit 1D. The second linear transporter 42 is a device for transporting a wafer W between three transfer positions (i.e., a fifth transfer position TP5, a sixth transfer position TP6, and a seventh transfer position TP7).

A lifter 44 for receiving a wafer W from the transfer robot 16 is disposed adjacent to the first transfer position TP1. The wafer W is transported from the transfer robot 16 to the first linear transporter 40 via the lifter 44. A shutter (not shown in the drawing) is provided on the partition 2a. This shutter is located between the lifter 44 and the transfer robot 16. When the wafer W is to be transported, the shutter is opened to allow the transfer robot 16 to transport the wafer W to the lifter 44.

A wafer W is transported to the lifter 44 by the transfer robot 16, then transported from the lifter 44 to the first linear transporter 40, and further transported to the polishing units 1A, 1B by the first linear transporter 40. The polishing head 24A of the first polishing unit 1A is movable between a position above the first polishing table 22A and the second transfer position TP2 by a swing motion of the polishing head 24A. Therefore, the wafer W is transferred to and from the polishing head 24A at the second transfer position TP2.

Similarly, the polishing head 24B of the second polishing unit 1B is movable between a position above the polishing table 22B and the third transfer position TP3, and a wafer W is transferred to and from the polishing head 24B at the third transfer position TP3. The polishing head 24C of the third polishing unit 1C is movable between a position above the polishing table 22C and the sixth transfer position TP6, and a wafer W is transferred to and from the polishing head 24C at the sixth transfer position TP6. The polishing head 24D of the fourth polishing unit 1D is movable between a position above the polishing table 22D and the seventh transfer position TP7, and a wafer W is transferred to and from the polishing head 24D at the seventh transfer position TP7.

A swing transporter 46 is provided between the first linear transporter 40, the second linear transporter 42, and the cleaning section 8. Transporting of a wafer W from the first linear transporter 40 to the second linear transporter 42 is performed by the swing transporter 46. The wafer W is transported to the third polishing unit 1C and/or the fourth polishing unit 1D by the second linear transporter 42.

A temporary stage 48 for a wafer W is disposed beside the swing transporter 46. This temporary stage 48 is secured to a non-illustrated frame. As shown in FIG. 1, the temporary stage 48 is disposed adjacent to the first linear transporter 40 and located between the first linear transporter 40 and the cleaning section 8. The swing transporter 46 is configured to transport a wafer W between the fourth transfer position TP4, the fifth transfer position TP5, and the temporary stage 48.

A wafer W, once placed on the temporary stage 48, is transported to the cleaning section 8 by a first transfer robot 50 of the cleaning section 8. The cleaning section 8 includes an upper cleaning lane and a lower cleaning lane. The upper cleaning lane includes an upper cleaning unit 52, an upper cleaning unit 54, and an upper drying unit 56. The lower cleaning lane includes a lower cleaning unit 60, a lower cleaning unit 62, and a lower drying unit 64. The details of the upper cleaning lane and the lower cleaning lane will be described later. In the cleaning units 52, 60 and the cleaning units 54, 62, a polished wafer W is cleaned with cleaning liquids (pure water and chemical liquid). In the drying units 56, 64, a cleaned wafer W is dried.

The first transfer robot 50 is operable to transport a wafer W from the temporary stage 48 to the upper cleaning unit 52 (or the lower cleaning unit 60) and further transport the wafer W from the upper cleaning unit 52 (or the lower cleaning unit 60) to the upper cleaning unit 54 (or the lower cleaning unit 62). A second transfer robot 58 is disposed between the cleaning unit 54, 62 and the drying unit 56, 64. This second transfer robot 58 is operable to transport the wafer W from the second cleaning unit 54 (or the lower cleaning unit 62) to the drying unit 56 (or the lower drying unit 64).

The dried wafer W is removed from the upper drying unit 56 (or the lower drying unit 64) and returned to the wafer cassette by the transfer robot 16. In this manner, a series of processes including polishing, cleaning, and drying of the wafer W is performed.

Figure 2:
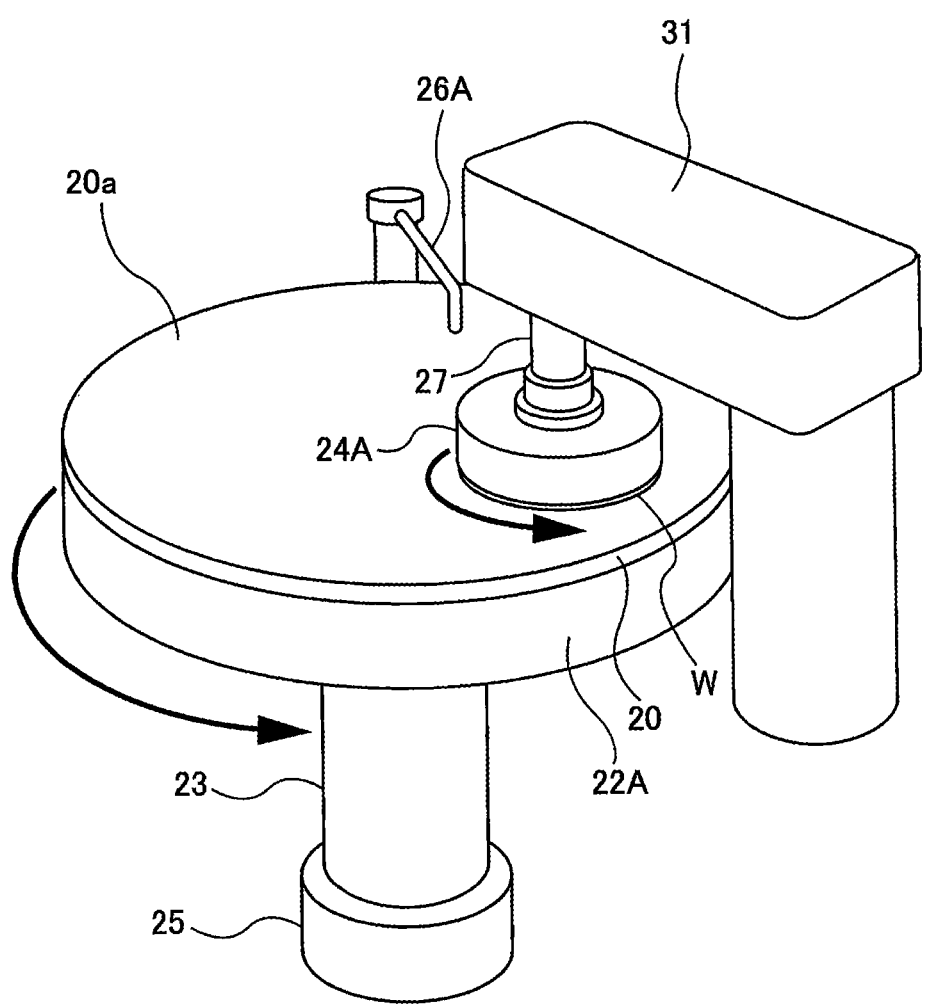
FIG. 2 is a perspective view of a first polishing unit.

The first polishing unit 1A, the second polishing unit 1B, the third polishing unit 1C, and the fourth polishing unit 1D have the same structure as each other. Therefore, the first polishing unit 1A will be described below. FIG. 2 is a schematic perspective view showing the first polishing unit 1A. As shown in FIG. 2, the first polishing unit 1A includes the polishing table 22A supporting the polishing pad 20, the polishing head 24A for pressing a wafer W against the polishing pad 20, and the polishing liquid supply nozzle 26A for supplying the polishing liquid (or slurry) onto the polishing pad 20. In FIG. 2, illustration of the first dressing unit 28A and the first atomizer 30A is omitted.

The polishing table 22A is coupled through a table shaft 23 to a table motor 25 disposed below the polishing table 22A, so that the polishing table 22A is rotated by the table motor 25 in a direction indicated by arrow. The polishing pad 20 is attached to an upper surface of the polishing table 22A. The polishing pad 20 has an upper surface, which provides a polishing surface 20a for polishing the wafer W. The polishing head 24A is secured to a lower end of a polishing head shaft 27. The polishing head 24A is configured to be able to hold the wafer W on its lower surface by vacuum suction. The polishing head shaft 27 is coupled to a rotating device (not shown) disposed in a polishing head arm 31, so that the polishing head 24A is rotated by the rotating device through the polishing head shaft 27.

Polishing of the surface of the wafer W is performed as follows. The polishing head 24A and the polishing table 22A are rotated in respective directions indicated by arrows, and the polishing liquid (or the slurry) is supplied from the polishing liquid supply nozzle 26A onto the polishing pad 20. In this state, the wafer W is pressed against the polishing surface 20a of the polishing pad 20 by the polishing head 24A. The surface of the wafer W is polished by a mechanical action of abrasive grains contained in the polishing liquid and a chemical action of a chemical component contained in the polishing liquid.

Figure 3A:
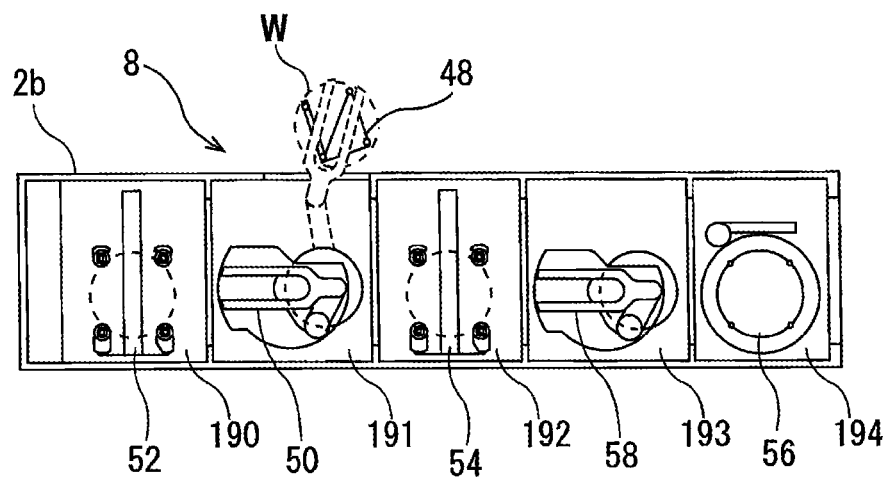
FIG. 3A is a plan view of a cleaning section.
Figure 3B:
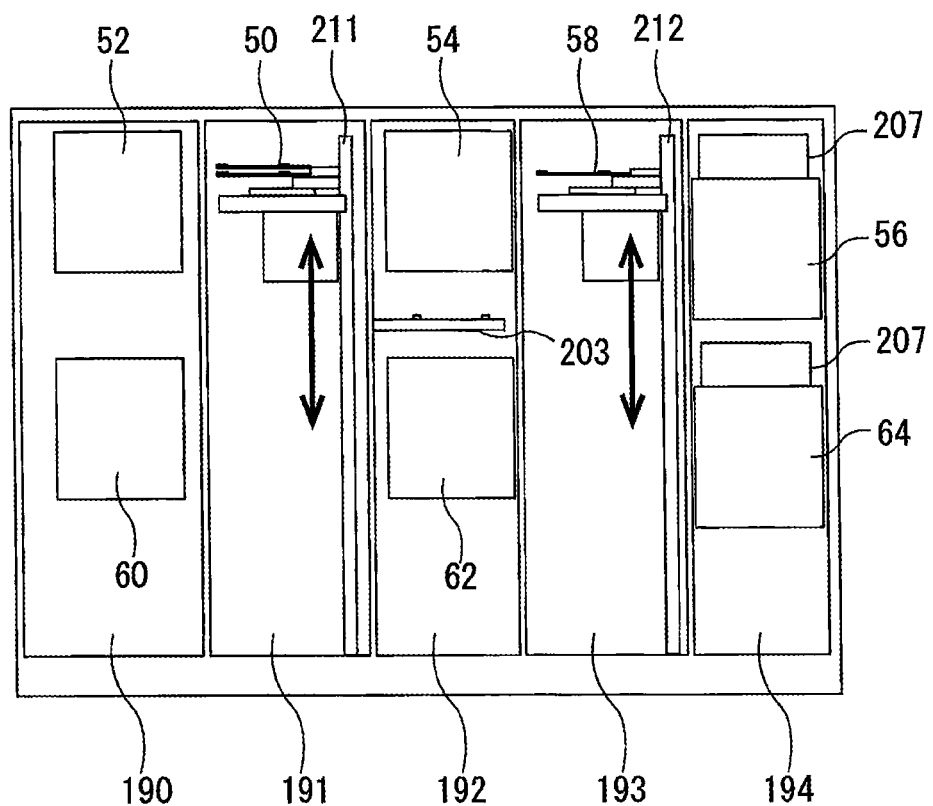
FIG. 3B is a side view of the cleaning section.

FIG. 3A is a plan view showing the cleaning section 8, and FIG. 3B is a side view showing the cleaning section 8. As shown in FIG. 3A and FIG. 3B, the cleaning section 8 is divided into a first cleaning chamber 190, a first transfer chamber 191, a second cleaning chamber 192, a second transfer chamber 193, and a drying chamber 194. In the first cleaning chamber 190, the upper cleaning unit 52 and the lower cleaning unit 60 are disposed. The upper cleaning unit 52 is arranged above the lower cleaning unit 60. Similarly, the upper cleaning unit 54 and the lower cleaning unit 62 are disposed in the second cleaning chamber 192. The upper cleaning unit 54 is arranged above the lower cleaning unit 62. Each of the cleaning units 52, 54, 60 and 62 is a cleaning machine for cleaning a wafer W using cleaning liquids, such as liquid chemical and pure water. The arrangement of these cleaning units 52, 60 and cleaning units 54, 62 along the vertical direction presents an advantage of reducing a footprint.

A temporary stage 203 for a wafer W is provided between the upper cleaning unit 54 and the lower cleaning unit 62. In the drying chamber 194, the upper drying unit 56 and the lower drying unit 64 are disposed. The upper drying unit 56 is arranged above the lower drying unit 64. Filter fan units 207, 207 are provided on upper portions of the upper drying unit 56 and the lower drying unit 64, respectively, so as to supply a clean air to these drying units 56, 64. The upper cleaning unit 52, the lower cleaning unit 60, the upper cleaning unit 54, the lower cleaning unit 62, the temporary stage 203, the upper drying unit 56, and the lower drying unit 64 are secured to non-illustrated frames by bolts or the like.

The vertically-movable first transfer robot 50 is provided in the first transfer chamber 191, and the vertically-movable second transfer robot 58 is provided in the second transfer chamber 193. The first transfer robot 50 and the second transfer robot 58 are movably supported by vertically-extending support shafts 211, 212, respectively. The first transfer robot 50 and the second transfer robot 58 have drive mechanisms (e.g., motors) therein, respectively, so that the transfer robots 50, 58 can move up and down along the support shafts 211, 212. The first transfer robot 50 has vertically arranged two hands: an upper hand and a lower hand. The first transfer robot 50 is located such that the lower hand thereof can access the above-described temporary stage 48, as indicated by a dotted line in FIG. 3A. When the lower hand of the first transfer robot 50 accesses the temporary stage 48, a shutter (not shown in the drawing) on the partition 2b is opened.

The first transfer robot 50 is configured to transport a wafer W between the temporary stage 48, the upper cleaning unit 52, the lower cleaning unit 60, the temporary stage 203, the upper cleaning unit 54, and the lower cleaning unit 62. When transporting a wafer W to be cleaned (i.e., a wafer W with slurry attached), the first transfer robot 50 uses its lower hand. On the other hand, when transporting a cleaned wafer W, the first transfer robot 50 uses its upper hand. The second transfer robot 58 is configured to transport a wafer W between the upper cleaning unit 54, the lower cleaning unit 62, the temporary stage 203, the upper drying unit 56, and the lower drying unit 64. The second transfer robot 58 transports only a cleaned wafer W, and thus has a single hand.

Figure 4:
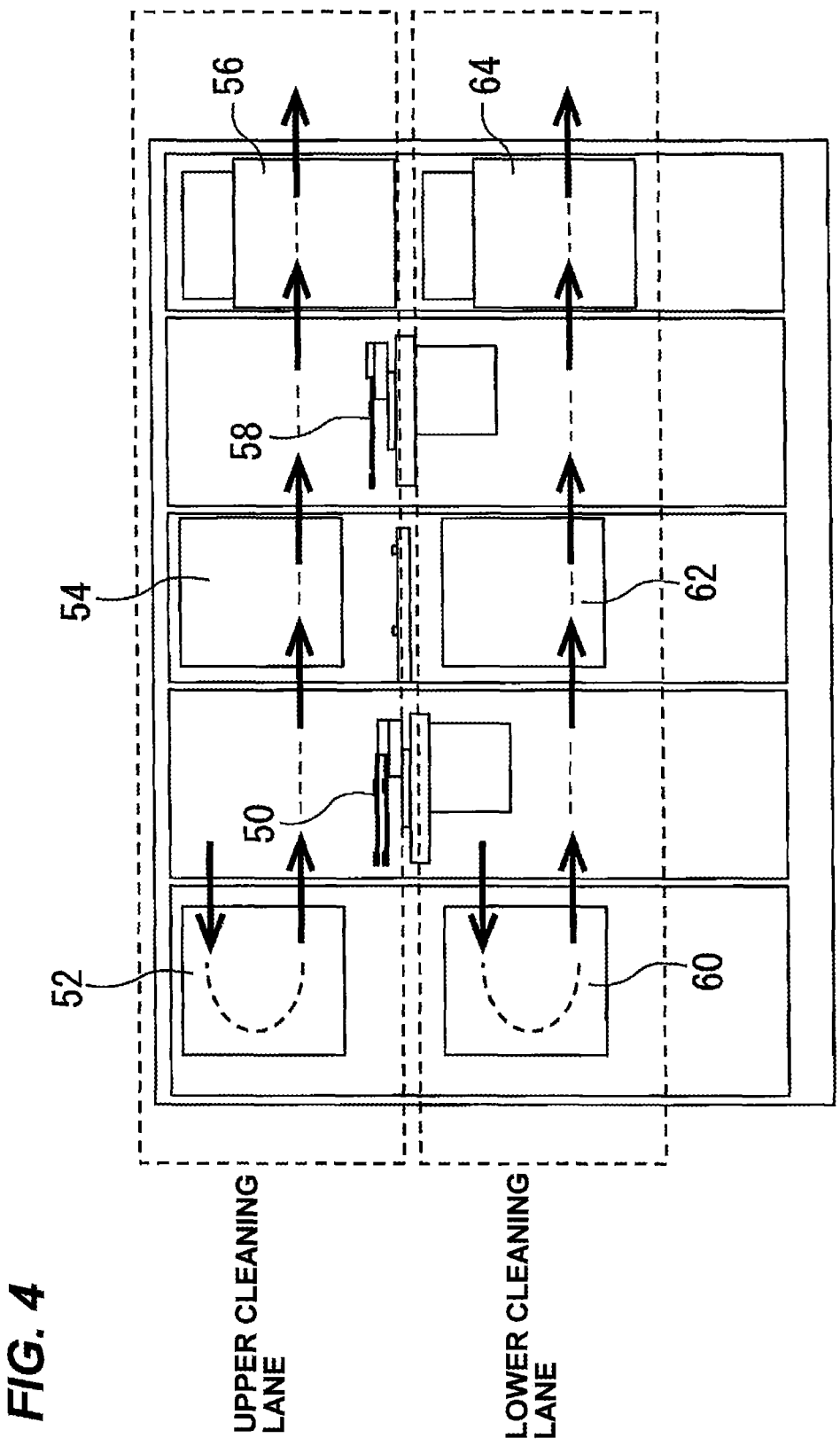
FIG. 4 is a schematic view of an upper cleaning lane and a lower cleaning lane.

As shown in FIG. 4, the cleaning section 8 includes the upper cleaning lane and the lower cleaning lane for cleaning a plurality of wafers W in parallel. The "cleaning lane" refers to a processing system composed of a plurality of cleaning units for cleaning a wafer W. The upper cleaning lane is one of a first cleaning lane and a second cleaning lane, and the lower cleaning lane is the other of the first cleaning lane and the second cleaning lane. The upper cleaning lane is composed of the upper cleaning unit 52, the upper cleaning unit 54 and the upper drying unit 56. The lower cleaning lane is composed of the lower cleaning unit 60, the lower cleaning unit 62 and the lower drying unit 64.

In the upper cleaning lane, one wafer W is transported in the order of: the first transfer robot 50, the upper cleaning unit 52, the first transfer robot 50, the upper cleaning unit 54, the second transfer robot 58, and the upper drying unit 56. In the lower cleaning lane, another wafer W is transported in the order of: the first transfer robot 50, the lower cleaning unit 60, the first transfer robot 50, the lower cleaning unit 62, the second transfer robot 58, and the lower drying unit 64. The two parallel cleaning lanes can simultaneously clean and dry a plurality of (typically two) wafers W. Each cleaning lane may include three or more cleaning units instead of the two cleaning units.

In this embodiment, the cleaning units 52, 60 and the cleaning units 54, 62 are roll sponge-type cleaning machines. The cleaning units 52, 60 and the cleaning units 54, 62 have the same construction, and therefore the following description will be made with respect to the upper cleaning unit 52.

Figure 5:
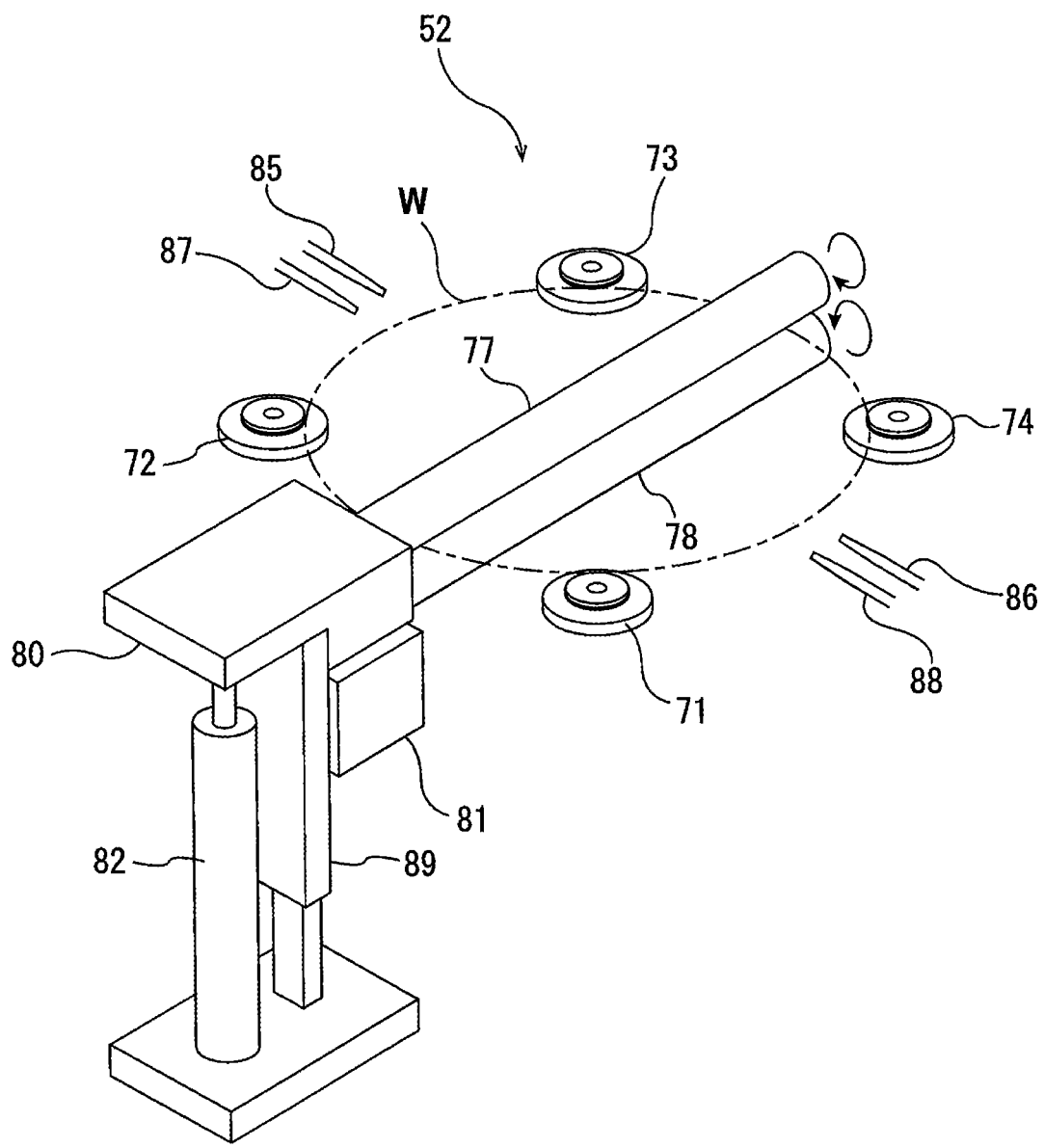
FIG. 5 is a perspective view of a cleaning unit.

FIG. 5 is a perspective view of the upper cleaning unit 52. As shown in FIG. 5, the upper cleaning unit 52 includes four holding rollers (substrate holders) 71, 72, 73, 74 for holding and rotating a wafer W in a horizontal position, roll sponges (cleaning tools) 77, 78 which make contact with upper and lower surfaces of the wafer W, rotating mechanisms 80, 81 for rotating the roll sponges 77, 78, upper pure-water supply nozzles 85, 86 for supplying pure water onto the upper surface of the wafer W, and upper liquid-chemical supply nozzles 87, 88 for supplying a mixture of a liquid chemical and pure water onto the upper surface of the wafer W. Though not shown diagrammatically, the upper cleaning unit 52 further includes lower pure-water supply nozzles for supplying pure water onto the lower surface of the wafer W, and lower liquid-chemical supply nozzles for supplying a mixture of a liquid chemical and pure water onto the lower surface of the wafer W. The upper pure-water supply nozzles 85, 86, the lower pure-water supply nozzles, the upper liquid-chemical supply nozzles 87, 88, and the lower liquid-chemical supply nozzles are coupled to a pure-water supply pipe which will be discussed later.

The holding rollers 71, 72, 73, 74 are movable in directions closer to and away from the wafer W by means of not-shown drive mechanisms (e.g. air cylinders). The rotating mechanism 80 for rotating the upper roll sponge 77 is mounted to a guide rail 89 that guides the vertical movement of the rotating mechanism 80. The rotating mechanism 80 is supported by a lift drive mechanism 82 so that the rotating mechanism 80 and the upper roll sponge 77 are moved vertically by the lift drive mechanism 82. Though not shown diagrammatically, the rotating mechanism 81 for rotating the lower roll sponge 78 is also supported by a guide rail, and the rotating mechanism 81 and the lower roll sponge 78 are moved vertically by a lift drive mechanism. A motor drive mechanism using a ball screw or an air cylinder may be used as each of the lift drive mechanisms. Upon cleaning of the wafer W, the roll sponges 77, 78 are moved closer to each other and come into contact with the upper and lower surfaces of the wafer W, respectively.

A process of cleaning the wafer W will now be described. First, the wafer W is rotated on its axis. Next, a mixture of a liquid chemical and pure water is supplied onto the upper surface and the lower surface of the wafer W from the upper liquid-chemical supply nozzles 87, 88 and the not-shown lower liquid-chemical supply nozzles. With the mixture being supplied onto the wafer W, the roll sponges 77, 78, which are rotating about their respective horizontally-extending axes, are rubbed against the upper and lower surfaces of the wafer W to thereby scrub-clean the upper and lower surfaces of the wafer W.

After the scrub cleaning, rinsing of the wafer W is performed by supplying pure water to the rotating wafer W from the upper pure-water supply nozzles 85, 86 and the lower pure-water supply nozzles. The rinsing of the wafer W may be performed while the roll sponges 77, 78 are being rubbed against the upper and lower surfaces of the wafer W or while the roll sponges 77, 78 are apart from the upper and lower surfaces of the wafer W.

Figure 6:
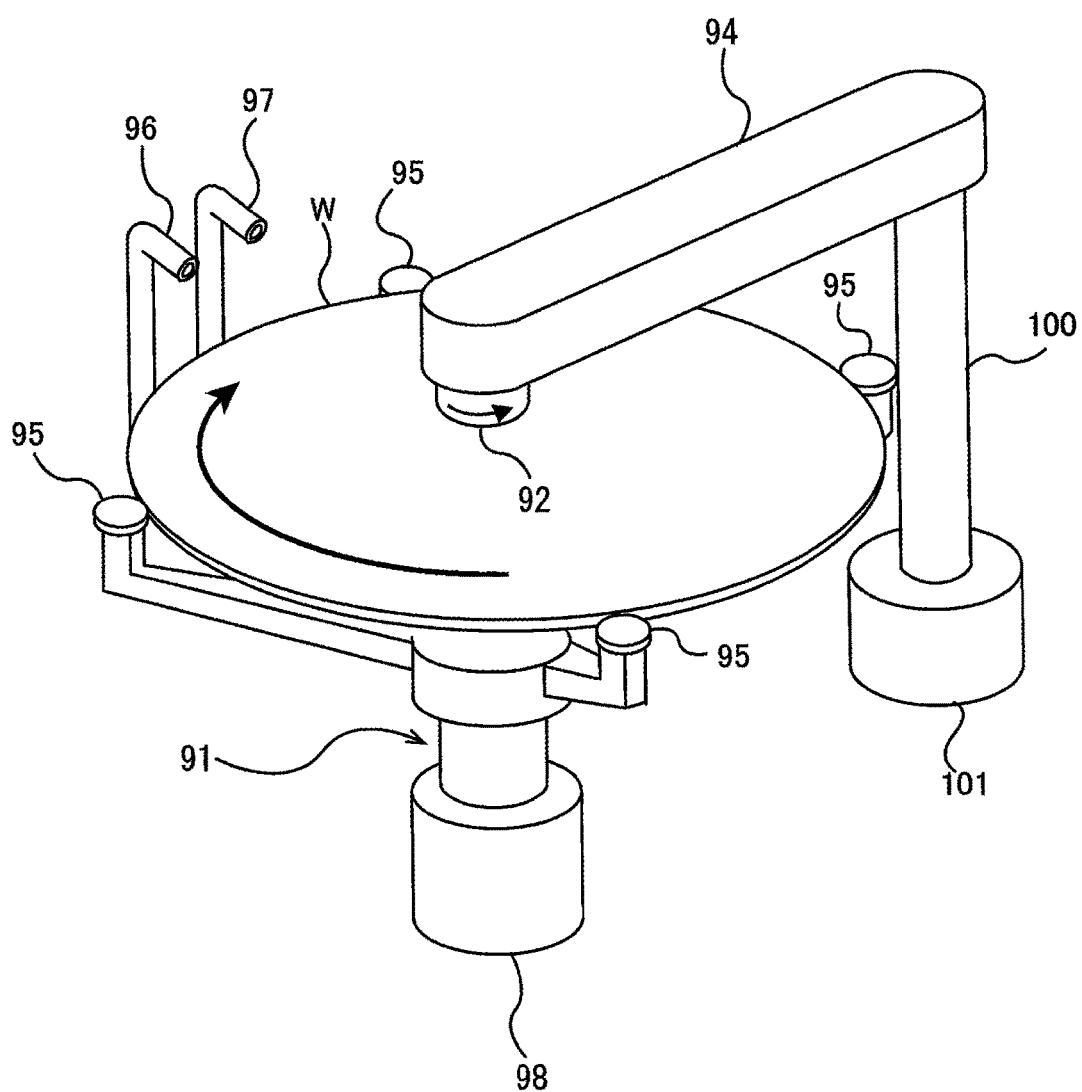
FIG. 6 is a perspective view of a pen sponge-type cleaning machine.

The cleaning units 52, 60 and/or the cleaning units 54, 62 may be pen sponge-type cleaning machines as shown in FIG. 6. For example, roll sponge-type cleaning machines may be used as the cleaning units 52, 60, and pen sponge-type cleaning machines may be used as the cleaning units 54, 62.

FIG. 6 is a perspective view of a pen sponge-type cleaning machine. As shown in FIG. 6, the cleaning machine of this type includes a substrate holder 91 for holding and rotating a wafer W, a pen sponge 92, an arm 94 holding the pen sponge 92, a pure-water supply nozzle 96 for supplying pure water onto the upper surface of the wafer W, and a liquid-chemical supply nozzle 97 for supplying a mixture of a liquid chemical and pure water onto the upper surface of the wafer W. The pen sponge 92 is coupled to a rotating mechanism (not shown) disposed within the arm 94, so that the pen sponge 92 is rotated about its vertically-extending axis. The pure-water supply nozzle 96 and the liquid-chemical supply nozzle 97 are coupled to the pure-water supply pipe which will be discussed later.

The substrate holder 91 has a plurality of (four in FIG. 6) chucks 95 for holding a periphery of the wafer W, and holds the wafer W in a horizontal position with the chucks 95. A motor 98 is coupled to the chucks 95, so that the wafer W, held by the chucks 95, is rotated about its axis by the motor 98.

The aim 94 is disposed above the wafer W. The pen sponge 92 is coupled to one end of the arm 94, while a pivot shaft 100 is coupled to the other end of the arm 94. A motor 101, serving as an arm rotating mechanism for pivoting the aim 94, is coupled to the pivot shaft 100. The aim rotating mechanism may include reduction gears or the like in addition to the motor 101. The motor 101 rotates the pivot shaft 100 through a predetermined angle to thereby cause the arm 94 to pivot in a plane parallel to the wafer W. As the arm 94 pivots, the pen sponge 92, supported by the aim 94, moves in the radial direction of the wafer W.

Cleaning of the wafer W by the pen sponge-type cleaning machine is performed in the following manner. First, the wafer W is rotated on its axis. Next, a mixture of a liquid chemical and pure water is supplied onto the upper surface of the wafer W from the liquid-chemical supply nozzle 97. With the mixture being supplied onto the wafer W, the pen sponge 92, which is rotating about its vertically-extending axis, is rubbed against the upper surface of the wafer W, and pivots in the radial direction of the wafer W. The upper surface of the wafer W is scrub-cleaned by the sliding contact with the pen sponge 92 in the presence of the liquid chemical.

After the scrub cleaning, in order to wash away the liquid chemical from the wafer W, the pure water is supplied from the pure-water supply nozzle 96 onto the upper surface of the rotating wafer W, thereby rinsing the wafer W. The rinsing of the wafer W may be performed while the pen sponge 92 is being rubbed against the wafer W or while the pen sponge 92 is apart from the wafer W.

Figure 7:
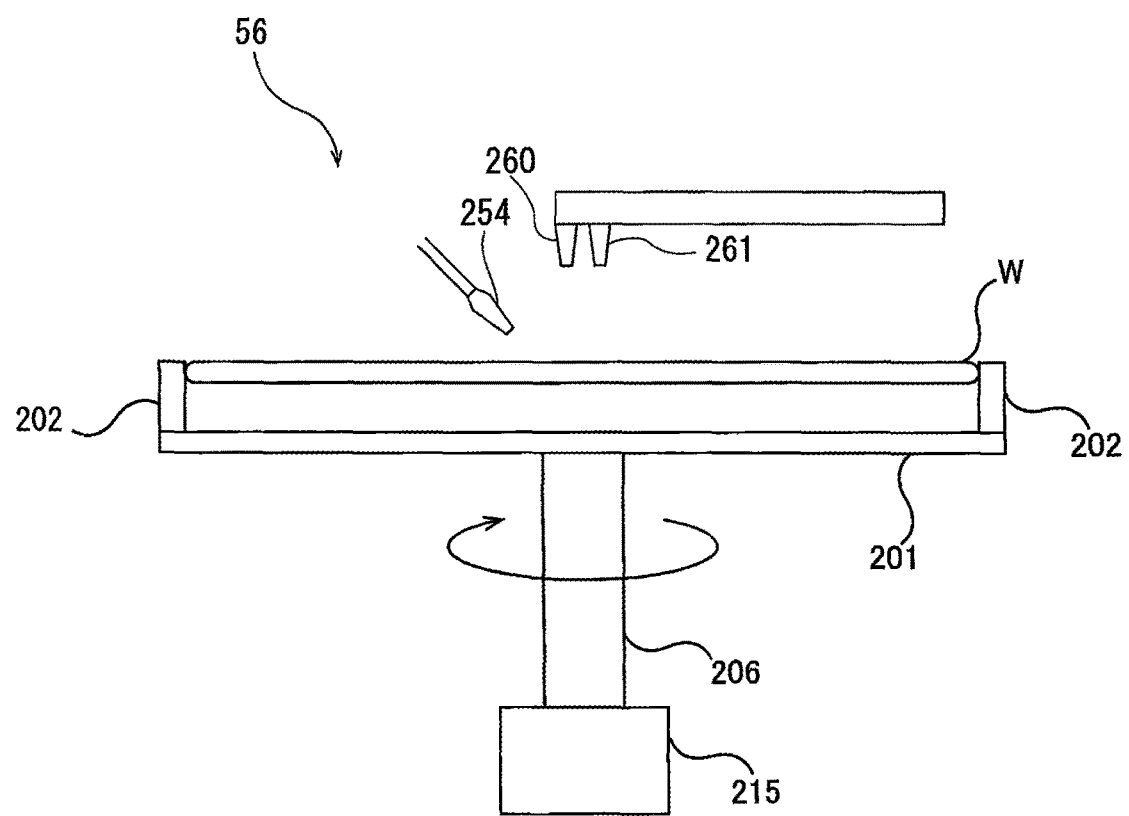
FIG. 7 is a vertical cross-sectional view of a drying unit.

The constructions of the upper drying unit 56 and the lower drying unit 64 will now be described. Both the upper drying unit 56 and the lower drying unit 64 are drying machines for performing Rotagoni drying. The upper drying unit 56 and the lower drying unit 64 have the same construction, and therefore the following description will be made with respect to the upper drying unit 56. FIG. 7 is a vertical cross-sectional view of the upper drying unit 56. The upper drying unit 56 includes a base 201 and four substrate support members 202 supported by the base 201. The base 201 is secured to an upper end of a rotational shaft 206. The rotational shaft 206 is coupled to a motor 215. When the motor 215 is set in motion, the base 201 rotates about its axis.

An upper pure-water supply nozzle 254 for supplying pure water to a front surface of a wafer W is disposed above the wafer W held by the base 201 with the substrate support members 202. The upper pure-water supply nozzle 254 is oriented toward the center of the wafer W. The upper pure-water supply nozzle 254 is coupled to the below-described pure-water supply pipe, so that pure water is supplied through the upper pure-water supply nozzle 254 to the center of the surface of the wafer W. Further, two parallel nozzles 260, 261 for performing Rotagoni drying are disposed above the wafer W. The nozzle 260 is to supply an IPA vapor (gas mixture of isopropyl alcohol and $N_2$ gas) to the surface of the wafer W. The nozzle 261 is to supply pure water to the surface of the wafer W so as to prevent drying of the surface, and is coupled to the below-described pure-water supply pipe. The nozzles 260, 261 are configured to be movable in the radial direction of the wafer W.

A not-shown lower pure-water supply nozzle and a not-shown gas nozzle are disposed within the rotational shaft 206. The pure-water supply pipe is coupled to the lower pure-water supply nozzle so that pure water is supplied through the lower pure-water supply nozzle to the back surface of the wafer W. A supply line for a dry gas, such as N₂ gas or dry air, is coupled to the gas nozzle so that the dry gas is supplied through the gas nozzle to the back surface of the wafer W.

The operation of the upper drying unit 56 having the above construction will now be described. First, the wafer W is rotated by the motor 215. While the wafer W is being rotated, the pure water is supplied to the front and back surfaces of the wafer W from the upper pure-water supply nozzle 254 and the lower pure-water supply nozzle (not shown), thereby rinsing the entire surfaces of the wafer W with the pure water. The pure water that has been supplied to the wafer W spreads over the entire front and back surfaces of the wafer W by centrifugal force, whereby the entire wafer W is rinsed. During the rinsing of the wafer W, the two nozzles 260, 261 are in predetermined standby positions apart from the wafer W.

Next, the supply of pure water from the pure-water supply nozzle 254 is stopped, and the pure-water supply nozzle 254 is moved to a predetermined standby position apart from the wafer W, while the two nozzles 260, 261 are moved to operating positions above the wafer W. While the wafer W is rotated at a low speed of 30 to 150 min$^{-1}$, the IPM vapor and the pure water are supplied from the nozzle 260 and the nozzle 261, respectively, to the front surface of the wafer W. At the same time, pure water is supplied to the back surface of the wafer W from the lower pure-water supply nozzle. The two nozzles 260, 261 are moved simultaneously in the radial direction of the wafer W. As a result, the front surface of the wafer W is dried.

Thereafter, the two nozzles 260, 261 are moved to the predetermined standby positions, and the supply of pure water from the lower pure-water supply nozzle is stopped. The wafer W is then rotated at a high speed of 1000 to 1500 min$^{-1}$ to force out the pure water adhering to the back surface of the wafer W while, at the same time, the dry gas is blown onto the back surface of the wafer W. In this manner, the back surface of the wafer W is dried. The dried wafer W is taken out of the upper drying unit 56 and returned to the wafer cassette by the transfer robot 16 shown in FIG. 1.

As described hereinabove, pure water is used in all of the upper cleaning unit 52, the upper cleaning unit 54, the upper drying unit 56, the lower cleaning unit 60, the lower cleaning unit 62, and the lower drying unit 64. The units 52, 54, 56, 60, 62, 64 are therefore coupled to a pure-water supply system.

Figure 8:
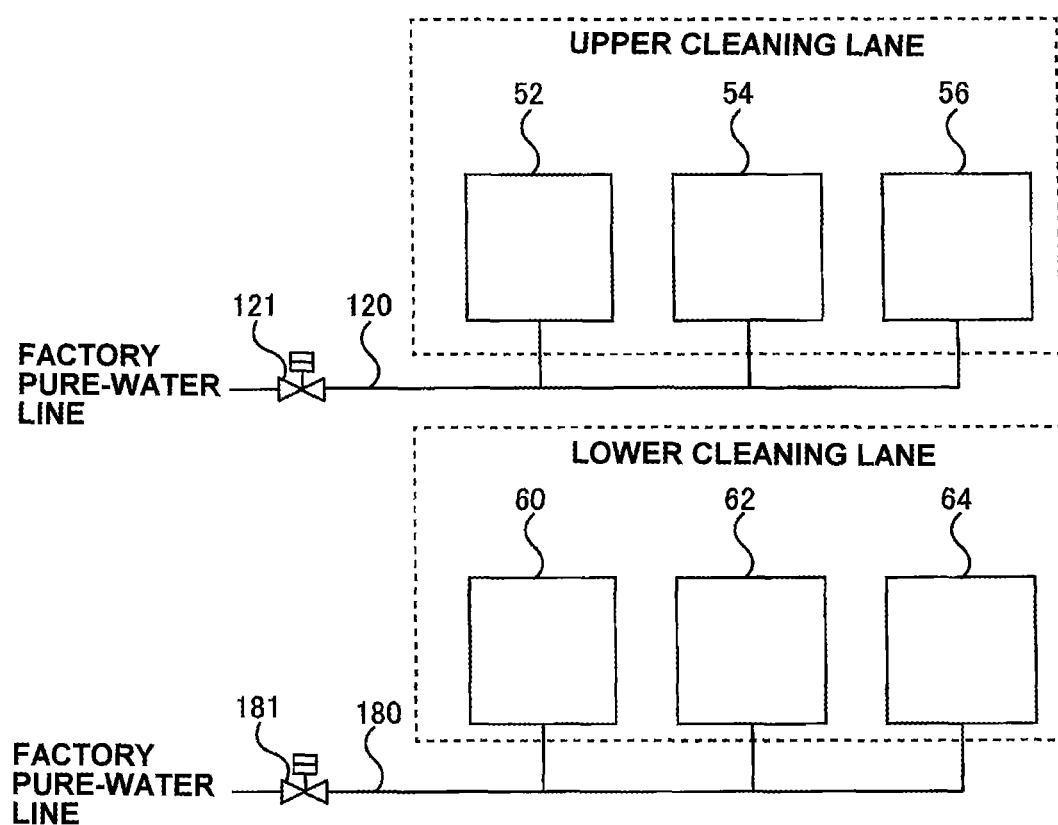
FIG. 8 is a diagram showing an example of a pure-water supply system for supplying pure water to cleaning units and drying units.

FIG. 8 is a diagram showing an example of the pure-water supply system for supplying pure water to the cleaning units and the drying units. As shown in FIG. 8, a first pure-water supply pipe 120 is coupled to the upper cleaning lane having the upper cleaning units 52, 54 and the upper drying unit 56, while a second pure-water supply pipe 180 is coupled to the lower cleaning lane having the lower cleaning units 60, 62 and the lower drying unit 64. The first pure-water supply pipe 120 and the second pure-water supply pipe 180 are coupled to factory pure-water lines, respectively, each of which is one of factory utilities.

The pure water to be used in the upper cleaning lane and the pure water to be used in the lower cleaning lane are supplied from the first pure-water supply pipe 120 and the second pure-water supply pipe 180, independently. The upper cleaning lane is one of the first cleaning lane and the second cleaning lane, and the lower cleaning lane is the other of the first cleaning lane and the second cleaning lane.

The first pure-water supply pipe 120 is equipped with a first main pure-water valve 121. When the first main pure-water valve 121 is opened, the pure water is supplied from the factory pure-water line to the first pure-water supply pipe 120; when the first main pure-water valve 121 is closed, supply of the pure water from the factory pure-water line to the first pure-water supply pipe 120 is stopped. The second pure-water supply pipe 180 is equipped with a second main pure-water valve 181. When the second main pure-water valve 181 is opened, the pure water is supplied from the factory pure-water line to the second pure-water supply pipe 180; when the second main pure-water valve 181 is closed, supply of the pure water from the factory pure-water line to the second pure-water supply pipe 180 is stopped.

As can be seen in FIG. 8, the supply of the pure water to the upper cleaning lane and the supply of the pure water to the lower cleaning lane are performed independently from each other. If bacteria have grown in one of the upper cleaning lane and the lower cleaning lane, the operation of that cleaning lane is stopped, and restoration, such as sterilization, is performed on that cleaning lane. Even in such a case, the other cleaning lane can continue cleaning and drying of wafers. Thus, the substrate processing apparatus can continue a sequence of processes including polishing, cleaning, and drying of a wafer.

Figure 9:
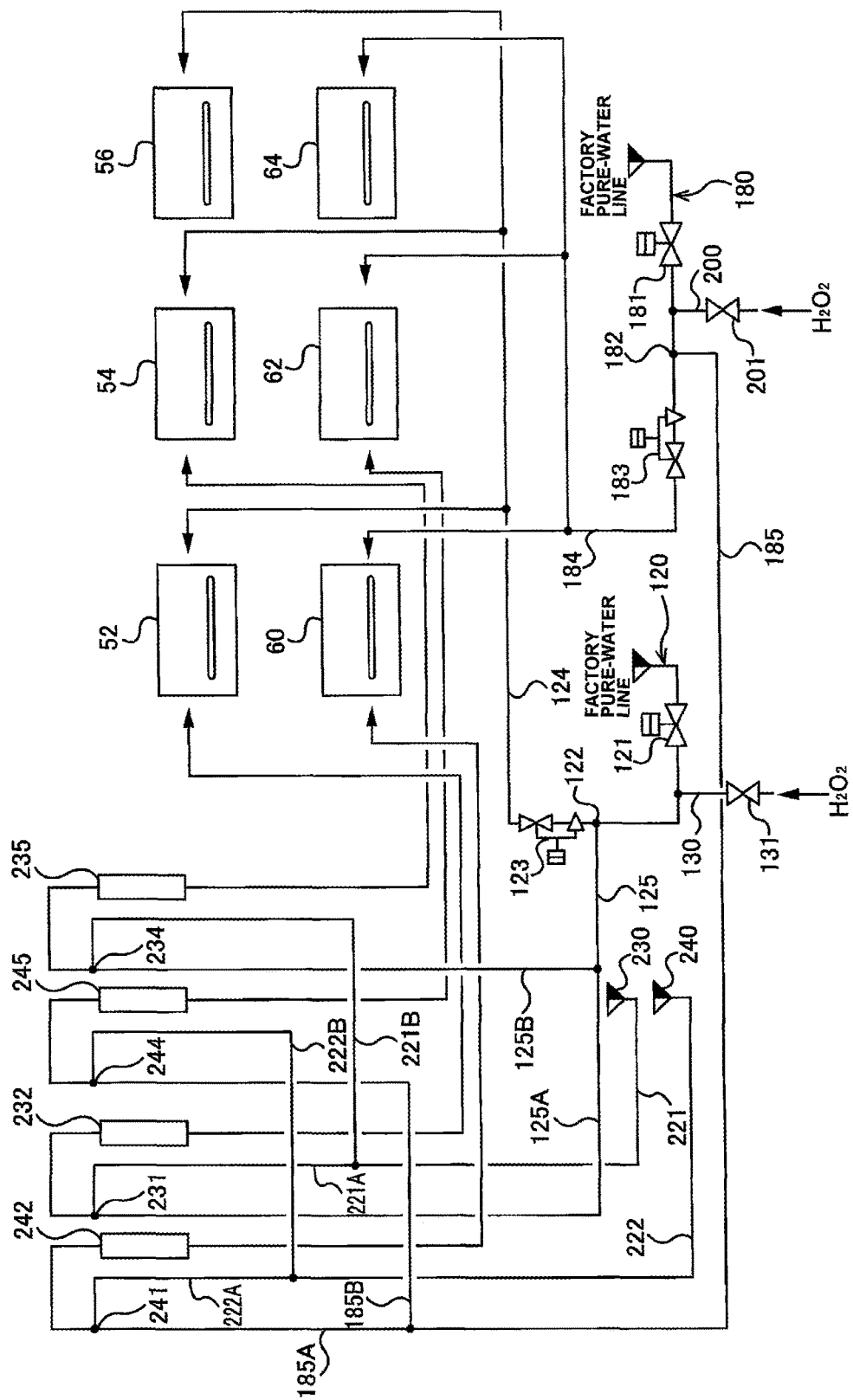
FIG. 9 is a diagram showing the details of the pure-water supply system.

FIG. 9 is a diagram showing the details of the pure-water supply system shown in FIG. 8. A first introduction port 130 for introducing a hydrogen peroxide solution into the first pure-water supply pipe 120 is attached to the first pure-water supply pipe 120 at the secondary side of the first main pure-water valve 121. An on-off valve 131 is attached to the first introduction port 130. This on-off valve 131 is normally closed except when introducing the hydrogen peroxide solution into the first pure-water supply pipe 120.

The first pure-water supply pipe 120 branches into a first pure-water supply line 124 and a first pure-water mixing line 125 at a branch point 122. The branch point 122 is located downstream of the first introduction port 130. The first pure-water supply line 124 extends to the upper cleaning unit 52, the upper cleaning unit 54 and the upper drying unit 56, and is coupled to the above-described pure-water supply nozzles 85, 86, 254, 261. In the case where the pen sponge-type cleaning machine shown in FIG. 6 is used as the cleaning units 52, 54, the first pure-water supply line 124 is coupled to the pure-water supply nozzle 96 shown in FIG. 6.

The first pure-water supply line 124 constitutes a part of the first pure-water supply pipe 120. The first pure-water supply line 124 is equipped with a first pressure regulating valve 123. The first pressure regulating valve 123 functions as a constant-pressure valve for keeping constant pressure of the pure water at the secondary side of the first pressure regulating valve 123. Therefore, even when the pressure of the pure water at the primary side of the first pressure regulating valve 123 fluctuates, the pressure of the pure water flowing to the upper cleaning unit 52, the upper cleaning unit 54 and the upper drying unit 56 can be kept constant.

The first pure-water mixing line 125 constitutes a part of the first pure-water supply pipe 120. The first pure-water mixing line 125 branches into a pure-water mixing line 125A and a pure-water mixing line 125B. The pure-water mixing line 125A is coupled to the liquid-chemical supply nozzles 87, 88 (see FIG. 5) of the upper cleaning unit 52 via a junction 231 and a mixer 232. The pure-water mixing line 125B is coupled to the liquid-chemical supply nozzles 87, 88 (see FIG. 5) of the upper cleaning unit 54 via a junction 234 and a mixer 235. In the case where the pen sponge-type cleaning machine shown in FIG. 6 is used as the cleaning units 52, 54, the pure-water mixing line 125A and the pure-water mixing line 125B are coupled to the liquid-chemical supply nozzle 97 shown in FIG. 6.

A liquid chemical is injected from a first liquid-chemical inlet 230 into a first liquid-chemical supply line 221. The first liquid-chemical supply line 221 branches into a liquid-chemical supply line 221A and a liquid-chemical supply line 221B. The liquid-chemical supply line 221A is coupled to the pure-water mixing line 125A at the junction 231 where the liquid chemical and the pure water join together. The liquid-chemical supply line 221B is coupled to the pure-water mixing line 125B at the junction 234 where the liquid chemical and the pure water join together.

The liquid chemical flowing in the liquid-chemical supply line 221A joins the pure water flowing in the pure-water mixing line 125A at the junction 231. The liquid chemical and the pure water further flow in the pure-water mixing line 125A, and are introduced into the mixer 232, where they are agitated and mixed. The mixture of the liquid chemical and the pure water further flows in the pure-water mixing line 125A, and is fed into the liquid-chemical supply nozzles 87, 88 (see FIG. 5) or the liquid-chemical supply nozzle 97 (see FIG. 6) of the upper cleaning unit 52.

The liquid chemical flowing in the liquid-chemical supply line 221B joins the pure water flowing in the pure-water mixing line 125B at the junction 234. The liquid chemical and the pure water further flow in the pure-water mixing line 125B, and are introduced into the mixer 235, where they are agitated and mixed. The mixture of the liquid chemical and the pure water further flows in the pure-water mixing line 125B, and is fed into the liquid-chemical supply nozzles 87, 88 (see FIG. 5) or the liquid-chemical supply nozzle 97 (see FIG. 6) of the upper cleaning unit 54.

The second pure-water supply pipe 180 has substantially the same construction as the first pure-water supply pipe 120. A second introduction port 200 for introducing a hydrogen peroxide solution into the second pure-water supply pipe 180 is attached to the second pure-water supply pipe 180 at the secondary side of the second main pure-water valve 181. An on-off valve 201 is attached to the second introduction port 200. This on-off valve 201 is normally closed except when introducing the hydrogen peroxide solution into the second pure-water supply pipe 180.

The second pure-water supply pipe 180 branches into a second pure-water supply line 184 and a second pure-water mixing line 185 at a branch point 182. The branch point 182 is located downstream of the second introduction port 200. The second pure-water supply line 184 extends to the lower cleaning unit 60, the lower cleaning unit 62 and the lower drying unit 64, and is coupled to the pure-water supply nozzles 85, 86, 254, 261. In the case where the pen sponge-type cleaning machine shown in FIG. 6 is used as the cleaning units 60, 62, the second pure-water supply line 184 is coupled to the pure-water supply nozzle 96 shown in FIG. 6.

The second pure-water supply line 184 constitutes a part of the second pure-water supply pipe 180. The second pure-water supply line 184 is equipped with a second pressure regulating valve 183. The second pressure regulating valve 183 functions as a constant-pressure valve for keeping constant pressure of the pure water at the secondary side of the second pressure regulating valve 183. Therefore, even when the pressure of the pure water at the primary side of the second pressure regulating valve 183 fluctuates, the pressure of the pure water flowing to the lower cleaning unit 60, the lower cleaning unit 62 and the lower drying unit 64 can be kept constant.

The second pure-water mixing line 185 constitutes a part of the second pure-water supply pipe 180. The second pure-water mixing line 185 branches into a pure-water mixing line 185A and a pure-water mixing line 185B. The pure-water mixing line 185A is coupled to the liquid-chemical supply nozzles 87, 88 (see FIG. 5) of the lower cleaning unit 60 via a junction 241 and a mixer 242. The pure-water mixing line 185B is coupled to the liquid-chemical supply nozzles 87, 88 (see FIG. 5) of the lower cleaning unit 62 via a junction 244 and a mixer 245. In the case where the pen sponge-type cleaning machine shown in FIG. 6 is used as the cleaning units 60, 62, the pure-water mixing line 185A and the pure-water mixing line 185B are coupled to the liquid-chemical supply nozzle 97 shown in FIG. 6.

The liquid chemical is injected from a second liquid-chemical inlet 240 into a second liquid-chemical supply line 222. The second liquid-chemical supply line 222 branches into a liquid-chemical supply line 222A and a liquid-chemical supply line 222B.

The liquid-chemical supply line 222A is coupled to the pure-water mixing line 185A at the junction 241 where the liquid chemical and the pure water join together. The liquid-chemical supply line 222B is coupled to the pure-water mixing line 185B at the junction 244 where the liquid chemical and the pure water join together.

The liquid chemical flowing in the liquid-chemical supply line 222A joins the pure water flowing in the pure-water mixing line 185A at the junction 241. The liquid chemical and the pure water further flow in the pure-water mixing line 185A, and are introduced into the mixer 242, where they are agitated and mixed. The mixture of the liquid chemical and the pure water further flows in the pure-water mixing line 185A, and is fed into the liquid-chemical supply nozzles 87, 88 (see FIG. 5) or the liquid-chemical supply nozzle 97 (see FIG. 6) of the lower cleaning unit 60.

The liquid chemical flowing in the liquid-chemical supply line 222B joins the pure water flowing in the pure-water mixing line 185B at the junction 244. The liquid chemical and the pure water further flow in the pure-water mixing line 185B, and are introduced into the mixer 245, where they are agitated and mixed. The mixture of the liquid chemical and the pure water further flows in the pure-water mixing line 185B, and is fed into the liquid-chemical supply nozzles 87, 88 (see FIG. 5) or the liquid-chemical supply nozzle 97 (see FIG. 6) of the lower cleaning unit 62.

A microscopic inspection is performed periodically on wafers W which have undergone a sequence of processes including polishing, cleaning and drying in the substrate processing apparatus. If bacteria have been found in the pure water, then living or dead bacteria can be detected on a wafer W upon its microscopic inspection. The substrate processing apparatus is configured to store a processing history showing either the upper cleaning lane or the lower cleaning lane through which the wafer W with bacteria on it has passed. Thus, it is possible to identify the cleaning lane which was used to clean the wafer W with bacteria on it. The cleaning lane in which bacteria have grown must be cleaned using a hydrogen peroxide solution. A pipe cleaning method for the substrate processing apparatus will now be described with reference to an example in which bacteria were found on a wafer W which has been processed in the upper cleaning lane.

Since the bacteria were detected on the wafer W which has been processed in the upper cleaning lane, cleaning of the first pure-water supply pipe 120 is performed. First, pure water is passed into the first pure-water supply pipe 120 for about 10 minutes so as to replace the pure water and the liquid chemical in the first pure-water supply pipe 120 with fresh pure water. As described previously, the first pure-water supply pipe 120 includes the first pure-water supply line 124 and the first pure-water mixing line 125. Not only the pure water but also the liquid chemical exists in the first pure-water mixing line 125. All the pure water and liquid chemical existing in the first pure-water supply pipe 120, the cleaning units 52, 54 and the upper drying unit 56 are replaced with the fresh pure water.

Next, the first main pure-water valve 121 is closed, thereby disconnecting the first pure-water supply pipe 120 from the factory pure-water line. If there is a factory utility (factory hydrogen peroxide solution line) in which a hydrogen peroxide solution flows, the factory hydrogen peroxide solution line is coupled to the first introduction port 130. If there is no factory hydrogen peroxide solution line, a container (or canister) in which a hydrogen peroxide solution is stored may be prepared and coupled to the first introduction port 130.

Next, the on-off valve 131 is opened, and a hydrogen peroxide solution is supplied through the first introduction port 130 into the first pure-water supply pipe 120 for about 15 minutes to replace the pure water in the first pure-water supply pipe 120 with the hydrogen peroxide solution. Thereafter, the on-off valve 131 is closed to stop the supply of the hydrogen peroxide solution, thereby keeping the first pure-water supply pipe 120 filled with the hydrogen peroxide solution.

The first pure-water supply pipe 120, which is filled with the hydrogen peroxide solution, is left as it is for a predetermined time. After elapse of the predetermined time, the first main pure-water valve 121 is opened to supply the pure water into the first pure-water supply pipe 120, thereby cleaning the interior of the first pure-water supply pipe 120 with the pure water. In order to ensure the replacement of the hydrogen peroxide solution in the first pure-water supply pipe 120 with the pure water and in order to ensure expelling of dead bacteria from the first pure-water supply pipe 120, the pure water is preferably supplied for at least one hour. Further, from the same viewpoint, the flow rate of pure water that flows in the first pure-water supply pipe 120 when cleaning of the first pure-water supply pipe 120 is performed is preferably higher than the flow rate of pure water that flows in the first pure-water supply pipe 120 when cleaning of a wafer is performed.

A concentration of hydrogen peroxide in the hydrogen peroxide solution for use in cleaning of the first pure-water supply pipe 120 is in a range of 5 to 6%. The predetermined time, during which the first pure-water supply pipe 120, filled with the hydrogen peroxide solution, is left as it is, is preferably not less than four hours.

Bacteria are known to die when they are immersed in a hydrogen peroxide solution having a concentration of about 2% for only a few seconds. Therefore, bacteria in the first pure-water supply pipe 120 can be killed by keeping the bacteria in contact with the hydrogen peroxide solution having the concentration of 5 to 6% for not less than four hours.

During the cleaning of the first pure-water supply pipe 120, cleaning and drying of wafers W can be performed in the lower cleaning lane. If bacteria have grown in the lower cleaning lane, then the second pure-water supply pipe 180 is cleaned in the same manner, while cleaning and drying of wafers W can be performed in the upper cleaning lane. In this embodiment, the first pure-water supply pipe 120 and the second pure-water supply pipe 180 are coupled to the upper cleaning lane and the lower cleaning lane, respectively, so as to supply pure water to the units 52, 54, 56, 60, 62, 64. Therefore, when bacteria have grown in one of the upper cleaning lane and the lower cleaning lane, the hydrogen peroxide solution can be introduced into only the pure-water supply pipe coupled to that cleaning lane in which the bacteria have grown. Accordingly, processing of wafers W can be continued in the cleaning lane in which no bacteria have grown.

Figure 10:
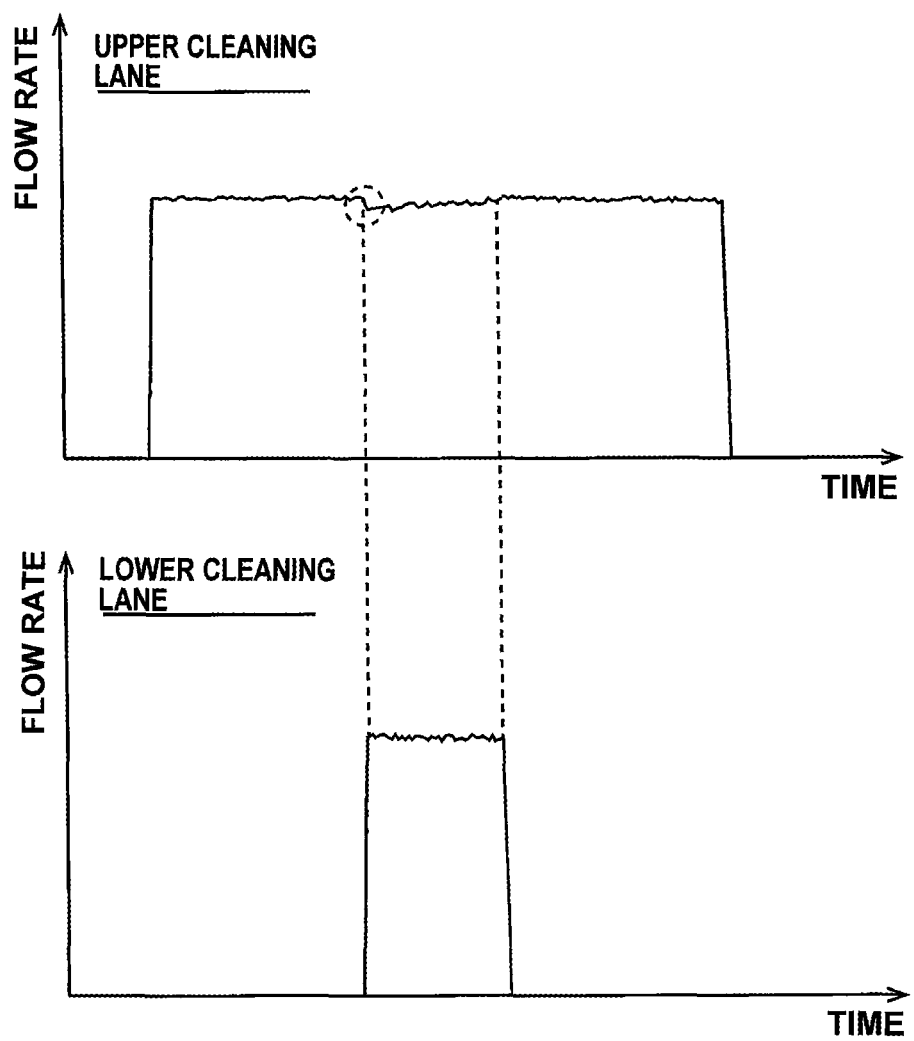
FIG. 10 is a graph showing flow rates in an upper cleaning lane and a lower cleaning lane in a conventional substrate processing apparatus.
Figure 12:
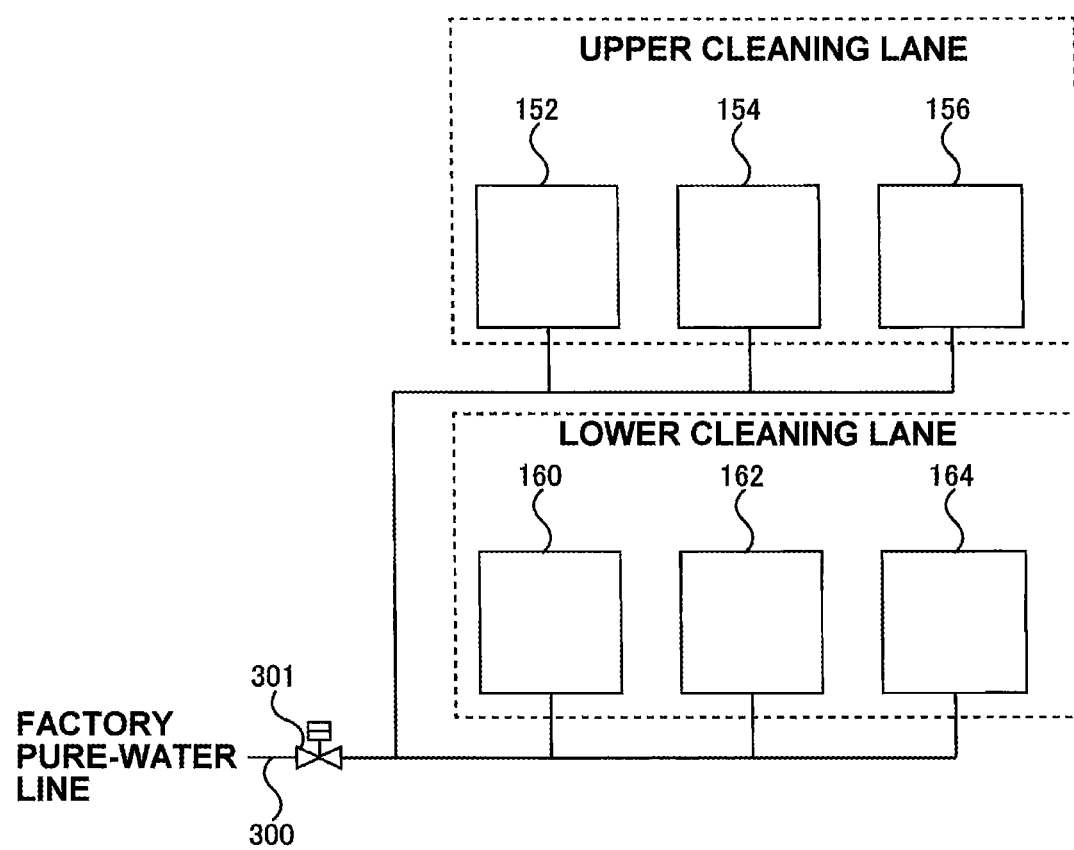
FIG. 12 is a schematic view showing layout of cleaning units and drying units in the conventional substrate processing apparatus.

It has been confirmed through experiments that providing the first pure-water supply pipe 120 and the second pure-water supply pipe 180 can further achieve the following advantageous effect. As shown in FIG. 12, in the conventional pure-water supply system, pure water is distributed from the single pure-water supply pipe 300 to the upper cleaning lane and the lower cleaning lane. With this arrangement of the conventional pure-water supply system, when use of pure water in the lower cleaning lane is started during use of pure water in the upper cleaning lane, a slight decrease in the flow rate of pure water will occur in the upper cleaning lane as shown in FIG. 10. FIG. 10 is a graph showing the flow rates in the upper cleaning lane and the lower cleaning lane.

Figure 11:
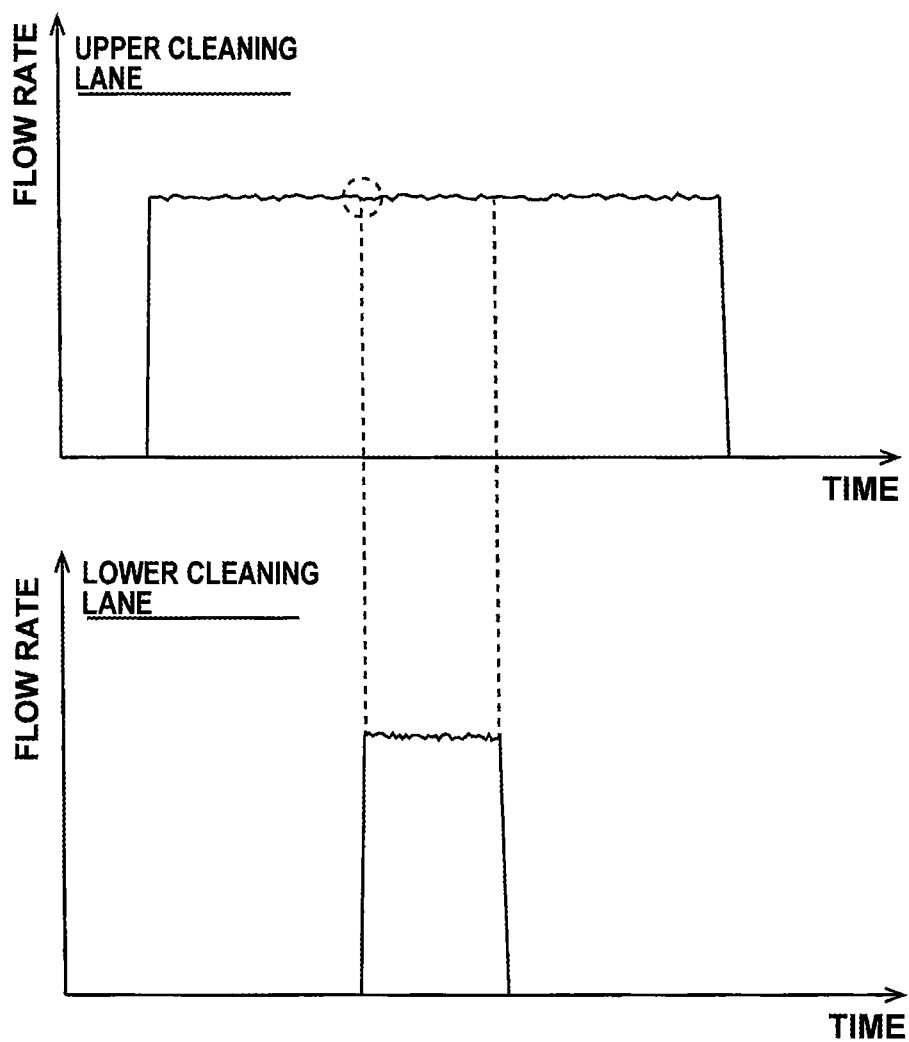
FIG. 11 is a graph showing flow rates in the upper cleaning lane and the lower cleaning lane in the substrate processing apparatus according to an embodiment of the present invention.

In contrast, as shown in FIG. 11, in the pure-water supply system of the above-described embodiment, the flow rate of pure water in the upper cleaning lane does not decrease even when the use of pure water in the lower cleaning lane is started during use of pure water in the upper cleaning lane. FIG. 11 is a graph showing the flow rates in the upper cleaning lane and the lower cleaning lane in the pure-water supply system of the above-described embodiment. As can be seen in FIG. 11, the flow rate of pure water is not affected by the use of pure water in the other cleaning lane. The cleaning units 52, 54, 60, 62 and the drying units 56, 64 can therefore supply pure water to a wafer at a uniform flow rate during cleaning of the wafer.

While the present invention has been described with reference to embodiments, it is understood that the present invention is not limited to the embodiments described above, and is capable of various changes and modifications within the scope of the technical concept as expressed in the claims, the specification and the drawings.

INDUSTRIAL APPLICABILITY

The present invention is applicable to a substrate processing apparatus for processing a substrate, such as a wafer, while supplying a cleaning liquid (e.g. pure water and a liquid chemical) to the substrate, and to a pipe cleaning method for the substrate processing apparatus.

REFERENCE SIGNS LIST

1 polishing section
8 cleaning section
52 upper cleaning unit
54 upper cleaning unit
56 upper drying unit
60 lower cleaning unit
62 lower cleaning unit
64 lower drying unit
120 first pure-water supply pipe
121 first main pure-water valve
122 branch point
123 first pressure regulating valve
124 first pure-water supply line
125 first pure-water mixing line 130 first introduction port
131 on-off valve
180 second pure-water supply pipe
181 second main pure-water valve
182 branch point
183 second pressure regulating valve
184 second pure-water supply line
185 second pure-water mixing line
200 second introduction port
201 on-off valve
221 first liquid-chemical supply line
222 second liquid-chemical supply line
231 junction
232 mixer
234 junction
235 mixer
241 junction
242 mixer
244 junction
245 mixer

What is claimed is:

1. A substrate processing apparatus comprising:
a plurality of polishing units for polishing a first substrate and a second substrate;
a first cleaning lane including a plurality of first cleaning units each for cleaning the first substrate while supplying pure water to the first substrate that has been polished by one of the plurality of the polishing units;
a second cleaning lane including a plurality of second cleaning units each for cleaning the second substrate while supplying pure water to the second substrate that has been polished by one of the plurality of the polishing units;
a transfer robot configured to transfer the first substrate to the first cleaning lane and transfer the second substrate to the second cleaning lane;
a first pure-water supply pipe including a first pure-water supply line, the first pure-water supply line is divided to extend to the plurality of first cleaning units, the first pure-water supply pipe having a first inlet to be coupled to a first factory pure-water line to draw pure-water therefrom; and
a first pressure regulating valve attached to the first pure-water supply line, the first pressure regulating valve being located upstream of a dividing point of the first pure-water supply line;
a second pure-water supply pipe including a second pure-water supply line, the second pure-water supply line is divided to extend to the plurality of second cleaning units, the second pure-water supply pipe having a second inlet to be coupled to a second factory pure-water line, the second pure-water supply pipe being separated from the first pure-water supply pipe to draw pure-water therefrom; and
a second pressure regulating valve attached to the second pure-water supply line, the second pressure regulating valve being located upstream of a dividing point of the second pure-water supply line.

2. The substrate processing apparatus according to claim 1, further comprising:
a first introduction port and a second introduction port for introducing a hydrogen peroxide solution into the first pure-water supply pipe and the second pure-water supply pipe, respectively.

3. The substrate processing apparatus according to claim 1:
wherein each of the first cleaning units include first pure-water supply nozzles each for supplying pure water to the first substrate, and first liquid-chemical supply-nozzles each for supplying a mixture of pure water and a liquid chemical to the first substrate; and
wherein the first pure-water supply pipe includes the first pure-water supply line coupled to the first pure-water supply nozzles, and a first pure-water mixing line coupled to the first liquid-chemical supply nozzles.

4. The substrate processing apparatus according to claim 3, wherein the first pure-water mixing line extends to the first liquid-chemical supply-nozzles via mixers for mixing the pure water and the liquid chemical.

5. The substrate processing apparatus according to claim 1:
wherein the second cleaning units include second pure-water supply nozzles each for supplying pure water to the second substrate, and second liquid-chemical supply nozzles each for supplying a mixture of pure water and a liquid chemical to the second substrate; and
wherein the second pure-water supply pipe include the second pure-water supply line coupled to the second pure-water supply nozzles, and a second pure-water mixing line coupled to the second liquid-chemical supply nozzles.

6. The substrate processing apparatus according to claim 5, wherein the second pure-water mixing line extends to the second liquid-chemical supply-nozzles via mixers for mixing the pure water and the liquid chemical.

7. The substrate processing apparatus according to claim 1, wherein:
the first cleaning lane further includes a first drying unit for supplying pure water to the first substrate and then drying the first substrate, the first drying unit being configured to rotate the first substrate; and
the second cleaning lane further includes a second drying unit for supplying pure water to the second substrate and then drying the second substrate, the second drying unit being configured to rotate the second substrate.

8. The substrate processing apparatus according to claim 1, wherein each of the first pure-water supply pipe and the second pure-water supply pipe can be connected to a factory pure-water line.

9. The substrate processing apparatus according to claim 3, wherein:
the first pure-water supply pipe branches into the first pure-water supply line and the first pure-water mixing line at a first branch point; and
the first pressure regulating valve is located downstream of the first branch point.

10. The substrate processing apparatus according to claim 5, wherein:
the second pure-water supply pipe branches into the second pure-water supply line and the second pure-water mixing line at a second branch point; and
the second pressure regulating valve is located downstream of the second branch point.

11. The substrate processing apparatus according to claim 1, wherein the first cleaning lane comprises an upper cleaning lane, and the second cleaning lane comprises a lower cleaning lane located below the upper cleaning lane.

12. The substrate processing apparatus according to claim 1, wherein the first factory pure-water line provides pure-water only to the plurality of first cleaning units, wherein the second factory pure-water line provides pure-water only to the plurality of second cleaning units, and wherein the first factory pure-water line and the second factory pure-water line are separated from one another such that a contamination of one of the lines cannot affect the other of the lines.

13. A substrate processing apparatus comprising:
- a first cleaning lane including a plurality of first cleaning units each for cleaning a substrate while supplying pure water to the substrate;
- a second cleaning lane including a plurality of second cleaning units each for cleaning a substrate while supplying pure water to the substrate;
- a first pure-water supply pipe for supplying the pure water to the first cleaning lane, the first pure-water supply pipe having a first inlet to be coupled to a first factory pure-water line; and
- a second pure-water supply pipe for supplying the pure water to the second cleaning lane, the second pure-water supply pipe having a second inlet to be coupled to a second factory pure-water line, the second pure-water supply pipe being separated from the first pure-water supply pipe.

* * * * *